(12) United States Patent
Noh et al.

(10) Patent No.: US 8,242,483 B2
(45) Date of Patent: Aug. 14, 2012

(54) METHOD FOR MANUFACTURING SEMICONDUCTOR LIGHT EMITTING DEVICE

(75) Inventors: Min Soo Noh, Yongin-si (KR); Hyun Chul Ko, Mobile, AL (US)

(73) Assignee: LG Electronics Inc., Seoul (KR)

( * ) Notice: Subject to any disclaimer, the term of this patent is extended or adjusted under 35 U.S.C. 154(b) by 334 days.

(21) Appl. No.: 12/120,311

(22) Filed: May 14, 2008

(65) Prior Publication Data

US 2008/0283869 A1   Nov. 20, 2008

(30) Foreign Application Priority Data

May 15, 2007  (KR) .................. 10-2007-0046963

(51) Int. Cl.
*H01L 33/20* (2010.01)
*H01S 5/20* (2006.01)

(52) U.S. Cl. ............... 257/13; 257/95; 257/E33.006; 372/45.01; 372/46.01

(58) Field of Classification Search .............. 257/13, 257/94, 95, 98, 103, E33.005, E33.006, E33.067; 372/45.01, 45.011
See application file for complete search history.

(56) References Cited

U.S. PATENT DOCUMENTS

2004/0012011 A1 * 1/2004 Tomiya et al. ............ 257/13
2007/0221932 A1 * 9/2007 Kano et al. ............... 257/96

* cited by examiner

*Primary Examiner* — Evan Pert
*Assistant Examiner* — Scott Stowe
(74) *Attorney, Agent, or Firm* — KED & Associates, LLP

(57) ABSTRACT

A method for manufacturing a semiconductor light emitting device, which is capable of providing high characteristic homogeneity and reproducibility, is disclosed. The disclosed method includes forming a buffer layer over a substrate, selectively growing a nitride crystal layer on the buffer layer, forming a nitride semiconductor layer having a multilayer structure over the nitride crystal layer, forming a first electrode on the nitride semiconductor layer, attaching an auxiliary substrate to the first electrode, separating the substrate from the nitride crystal layer, forming a second electrode on the nitride crystal layer exposed in accordance with the separation of the substrate, and removing the auxiliary substrate from the first electrode.

19 Claims, 10 Drawing Sheets

METHOD FOR MANUFACTURING SEMICONDUCTOR LIGHT EMITTING DEVICE

This application claims the benefit of Korean Patent Application No. 10-2007-0046963, filed on May 15, 2007, which is hereby incorporated by reference as if fully set forth herein.

BACKGROUND OF THE INVENTION

1. Field of the Invention

The present invention relates to a method for manufacturing a semiconductor light emitting device, and more particularly, to a method for manufacturing a semiconductor light emitting device, which is capable of providing high characteristic homogeneity and reproducibility.

2. Discussion of the Related Art

By virtue of the recent technical advance, a celadon green semiconductor laser has been commercially available. Currently, the celadon green semiconductor laser is used as a light source for high-density information recording appliances such as HD-DVD and Blue-ray Disk systems, display appliances, illumination appliances, etc.

However, the market of the celadon green semiconductor laser is still restricted due to the insufficient power, short life span, and high price of the celadon green semiconductor laser. To this end, it is necessary to develop a technique capable of inexpensively manufacturing a device having an increased optical power and a high reliability.

Recently, a technique capable of fabricating a single-crystalline GaN-based substrate having a large area has been developed. This technique uses a method of growing a thick film over a sapphire or GaAs substrate in an unbalanced state, using a vapor deposition process, and then removing the substrate used as a mother body.

In the case of the single-crystalline GaN-based substrate fabricated in accordance with the vapor deposition method, however, it is difficult to stably secure a desired homogeneity because the single-crystalline GaN-based substrate is fabricated by growing a thick GaN crystalline film over a mother substrate such as a sapphire substrate, different from a Si single-crystalline substrate obtained by cutting a large ingot. Furthermore, the thick GaN film may be subjected to stress due to the thermal expansion coefficient difference between the GaN film and the mother substrate. As a result, the GaN film may be bent or may have much crystal defect.

In addition, there is a problem or limitation in reducing the manufacturing costs because a complex post process is required to remove the mother substrate. For this reason, a single-crystalline GaN substrate having a high quality is expensive, and has a limitation on the supply amount thereof.

As a result, where a semiconductor device is fabricated on the above-mentioned single-crystalline GaN-based substrate, which is inhomogeneous, there is a problem in that the characteristics and reproducibility of the semiconductor device are greatly influenced by the conditions of the substrate, so that the yield of good-quality products may be degraded.

Under the above-mentioned circumstance, it is required to provide a technique capable of inexpensively producing a homogeneous single-crystal GaN-based substrate having a high quality or a technique capable of reproducibly fabricating devices, using the same GaN-based substrate, as the substrate is again used, after the fabrication of one device, to fabricate another device.

SUMMARY OF THE INVENTION

Accordingly, the present invention is directed to a method for manufacturing a semiconductor light emitting device that substantially obviates one or more problems due to limitations and disadvantages of the related art.

An object of the present invention is to provide a method for manufacturing a semiconductor light emitting device, which is capable of achieving a reduction in the manufacturing costs of the device, an enhancement in the homogeneity of the characteristics of the device, and an enhancement in the reproducibility of a manufacturing process including a crystal growing process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for manufacturing a semiconductor light emitting device comprises: forming a buffer layer over a substrate; selectively growing a nitride crystal layer on the buffer layer; forming a nitride semiconductor layer having a multilayer structure over the nitride crystal layer; forming a first electrode on the nitride semiconductor layer; attaching an auxiliary substrate to the first electrode; separating the substrate from the nitride crystal layer; forming a second electrode on the nitride crystal layer exposed in accordance with the separation of the substrate; and removing the auxiliary substrate from the first electrode.

In another aspect of the present invention, a method for manufacturing a semiconductor light emitting device comprises: forming a mask layer having an opening on a substrate; forming a semiconductor crystal layer having a ridge-shaped structure on the mask layer; forming a semiconductor layer having a multilayer structure over the semiconductor crystal layer; forming a first electrode on the semiconductor layer; attaching an auxiliary substrate to the first electrode; separating the substrate from the semiconductor crystal layer; and forming a second electrode on the semiconductor crystal layer exposed in accordance with the separation of the substrate.

In another aspect of the present invention, a method for manufacturing a semiconductor light emitting device comprises: selectively growing a nitride crystal layer on a substrate; forming a nitride semiconductor layer having a multilayer structure over the nitride crystal layer; forming a first electrode on the nitride semiconductor layer; forming an auxiliary substrate on the first electrode; separating the substrate from the nitride crystal layer; forming a second electrode on the nitride crystal layer exposed in accordance with the separation of the substrate; and cleaving the resultant structure in a direction normal to a crystal growth direction of the nitride crystal layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
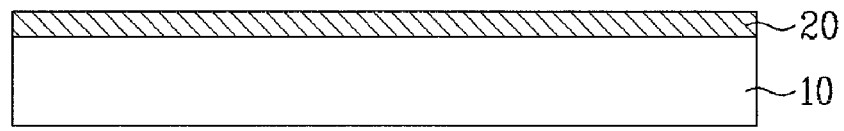
FIG. 1 is a sectional view illustrating a procedure for forming a buffer layer over a substrate.

Reference will now be made in detail to the preferred embodiments of the present invention, examples of which are illustrated in the accompanying drawings.

The present invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

It will be understood that, although the terms first, second, etc. may be used herein to describe various elements, components, regions, layers and/or sections, these elements, components, regions, layers and/or sections should not be limited by these terms.

Hereinafter, an exemplary embodiment of the present invention will be described in detail with reference to the accompanying drawings.

First, a buffer layer 20 is formed over a mother substrate 10, as shown in FIG. 1. For the substrate 10, a single-crystalline GaN substrate may be used. A sapphire substrate or other semiconductor substrates may also be used.

The buffer layer 20 is formed to a thickness of several nanometers to several ten nanometers. It is preferred that, as the buffer layer 20, a nitride metal thin film be grown directly over the mother substrate. Of course, the buffer layer 20 may be formed by depositing a metal layer, and exposing the deposited metal layer to a nitrogen or ammonia gas atmosphere at high temperature, to nitrify the metal layer, or exposing the deposited metal layer to a gas atmosphere containing oxygen, to oxidize the metal layer.

The buffer layer 20 may comprise a metal. In particular, the buffer layer 20 may be made of one selected from Ni, Ti, Cr, Ta, Mo, Mg, Zn, Ga, Al, Cu, Co, Fe, W, and V, an alloy thereof, a metal nitride thereof, or a metal oxide thereof.

The buffer layer 20 may also be made of a nitride or an oxide. In particular, the buffer layer 20 may be made of a nitride or oxide comprising at least one of B, Si, Ru, Mn, Zr, Hf, Sr, Rb, Be, and Li.

Figure 2:
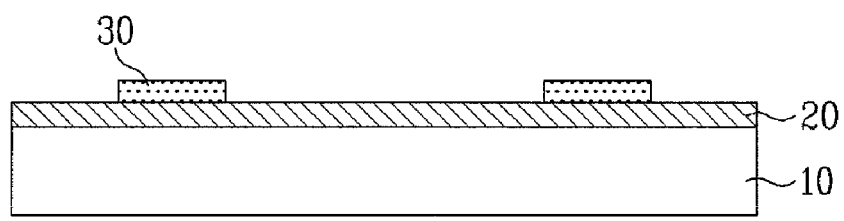
FIG. 2 is a sectional view illustrating a procedure for forming a mask for selective growth on the buffer layer.
Figure 3:
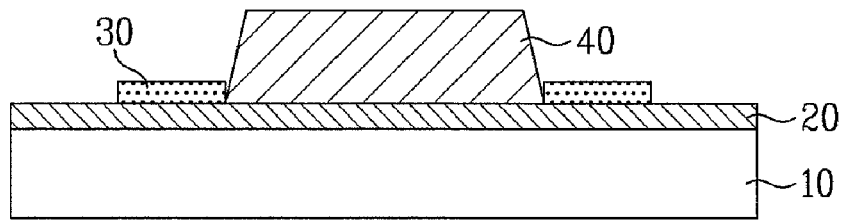
FIG. 3 is a sectional view illustrating a procedure for forming a nitride crystal layer having a ridge-shaped structure.

A mask 30 for selective growth is formed on the buffer layer 20, as shown in FIG. 2. The formation of the mask 30 is achieved by forming a thin film over the buffer layer 20, using a dielectric material such as a nitride or an oxide, for example, $SiO_2$, or a material preventing GaN-based crystals from being grown over the surface of the material at high temperature, for example, tungsten (W), and then patterning the thin film, using a general photolithography process, such that the thin film has stripe-shaped patterns spaced from one another to define openings.

When the stripe patterns of the mask 30 are aligned to be parallel to a [1-100] crystalline direction of nitride semiconductor, a crystal surface normal to the [1-100] crystalline direction, namely, a [11-20] crystal surface, is rendered a natural cleavage surface. In this case, accordingly, it is possible to advantageously form the mirror surface of a laser device, using a natural cleaving method.

On the other hand, where the mirror surface of the laser device is formed using a method other than the natural cleaving method, for example, a dry etching method, the extension direction of the stripe patterns of the mask 30 may be aligned with a crystalline direction different from the above-described crystalline direction.

The process for forming the buffer layer 20 may be carried out after the formation of the mask 30 on the mother substrate 10. Of course, in this case, similar effects are obtained. Also, of the processes used to form the buffer layer 20 over the mother substrate 10, only the nitrifying or oxidizing process may be carried out after the formation of the mask 30.

Thereafter, the mother substrate 10 formed with the buffer layer 20 and mask 30 is loaded in a reactor for growth of semiconductor crystals. A ridge-shaped nitride crystal layer 40 is then selectively formed on the mother substrate 10, using a material such as a gallium nitride semiconductor.

Alternatively, where the buffer layer 20 is formed in the reactor for growth of semiconductor crystals, the selective growth of the nitride crystal layer 40 may be achieved in real time (in-situ growth), following the formation of the buffer layer 20.

Also, following the execution of the nitrifying or oxidizing process for the metal buffer layer 20, the crystals of the ridge-shaped nitride crystal layer 40 may be grown in real time (in-situ growth).

When GaN-based semiconductor crystals are grown at high temperature, no or little semiconductor crystals are grown over the mask 30 used for the selective crystal growth. The growth of the semiconductor crystals occurs mainly on the buffer layer 20. Accordingly, it is possible to easily obtain the ridge-shaped nitride crystal layer 40.

The cross-sectional shape of the crystals of the ridge-shaped nitride crystal layer 40 depends on the material of the mask 30 and the given crystal growth conditions. Generally, the crystals have a rectangular or trapezoidal cross-sectional shape. In some cases, the crystals may have a polygonal cross-sectional shape having high-dimensional crystal surfaces.

It is preferred that the crystal growth of the ridge-shaped nitride crystal layer 40 be carried out, using a hydride vapor phase epitaxy (HVPE) method, because the crystal growth time can be reduced. Of course, a metal organic chemical vapor deposition (MOCVD) method or a molecular beam epitaxy (MBE) method may be used in accordance with the structure of the device.

Where the HVPE method is used, the mother substrate 10 is unloaded from the reactor after the crystal growth of the ridge-shaped nitride crystal layer 40, and is then loaded in a reactor of MOCVD or MBE equipment, to be subjected to a subsequent process.

Figure 4:
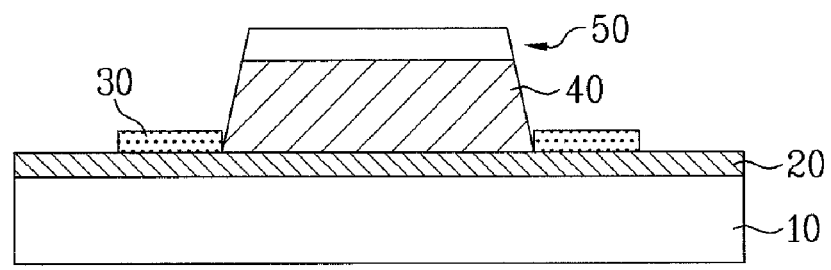
FIG. 4 is a sectional view illustrating a nitride semiconductor layer formed in a laser device structure shown in FIG. 3.

On the other hand, where the MOCVD method is used, a multilayer nitride semiconductor layer 50 for a laser device is grown over the ridge-shaped nitride crystal layer 40 in a successive manner, as shown in FIG. 4.

Figure 5A:
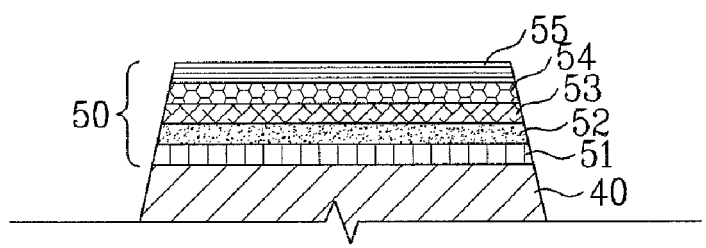
FIG. 5A is a sectional view illustrating an exemplary embodiment of a detailed structure of the nitride semiconductor layer.

The multilayer nitride semiconductor layer 50 typically includes n-type semiconductor layers 51 and 52, an active layer 53, and p-type semiconductor layers 54 and 55. In detail, as shown in FIG. 5, the multilayer nitride semiconductor layer 50 may include a first clad layer 51, a first light guide layer 52, an active layer 53 having a quantum well structure, a second light guide layer 54, and a second clad layer 55.

Figure 5B:
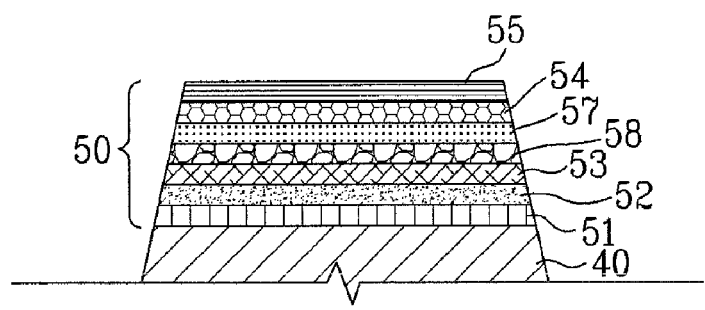
FIG. 5B is a sectional view illustrating another embodiment of the detailed structure of the nitride semiconductor layer.

In the above-described structure of the semiconductor layer 50, light is emitted as holes introduced from the p-type semiconductor layers 54 and 55 into the active layer 53 are combined with electrons introduced from the n-type semiconductor layers 51 and 52 into the active layer 53. When an electron block layer 57 is formed over the active layer 53, as shown in FIG. 5B, it can assist the electrons and holes to be recombined. That is, the electron block layer 57 increases the probability that the electrons, which are lighter than the holes, participate in the recombination with the holes without emerging from the active layer as they are.

Figure 6A:
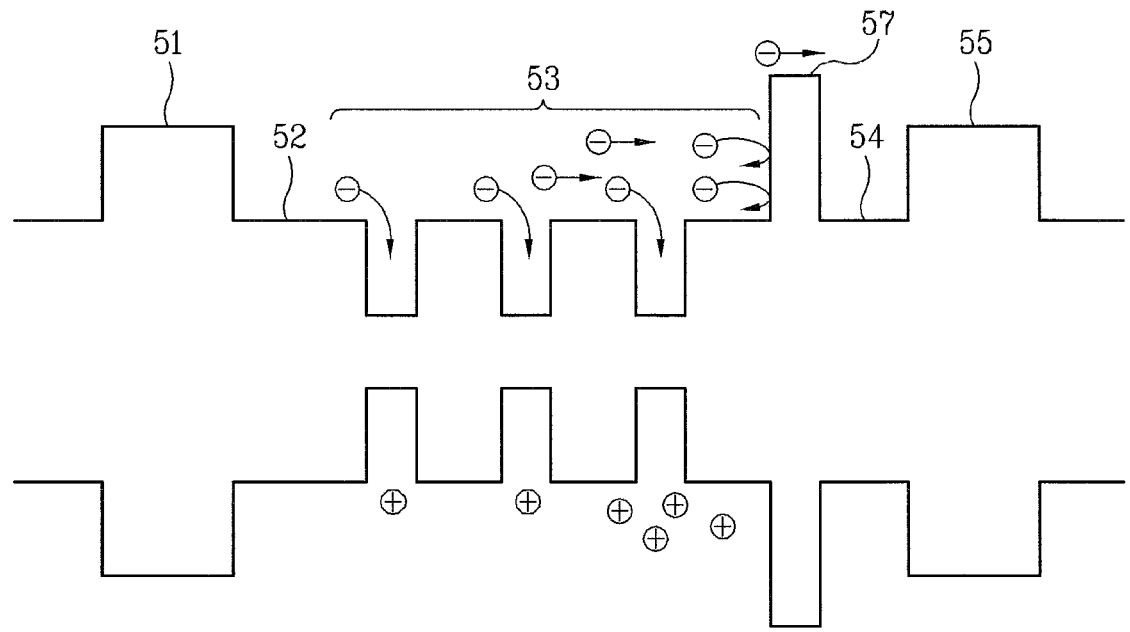
FIG. 6A is an energy band diagram in the case in which the nitride semiconductor layer includes an electron block layer.

That is, the semiconductor layer 50 may further include the electron block layer 57, which is formed between the active layer 53 and the second light guide layer 54. An energy band diagram in this case is shown in FIG. 6A. Typically, the active layer 53 may be made of an InGaN material, whereas the electron block layer 57 may be made of an AlGaN material. In this case, however, strain may be generated due to a large lattice constant difference between the InGaN material and the AlGaN material.

To this end, an intermediate layer 58 may be additionally formed to reduce stain generated due to a physical property difference between the active layer 53 and the electron block layer 57, for example, the above-described lattice constant difference.

The intermediate layer 58 may have a composition ranging between the composition of the active layer 53 and the composition of the electron block layer 57. This will be described in detail.

Figure 6B:
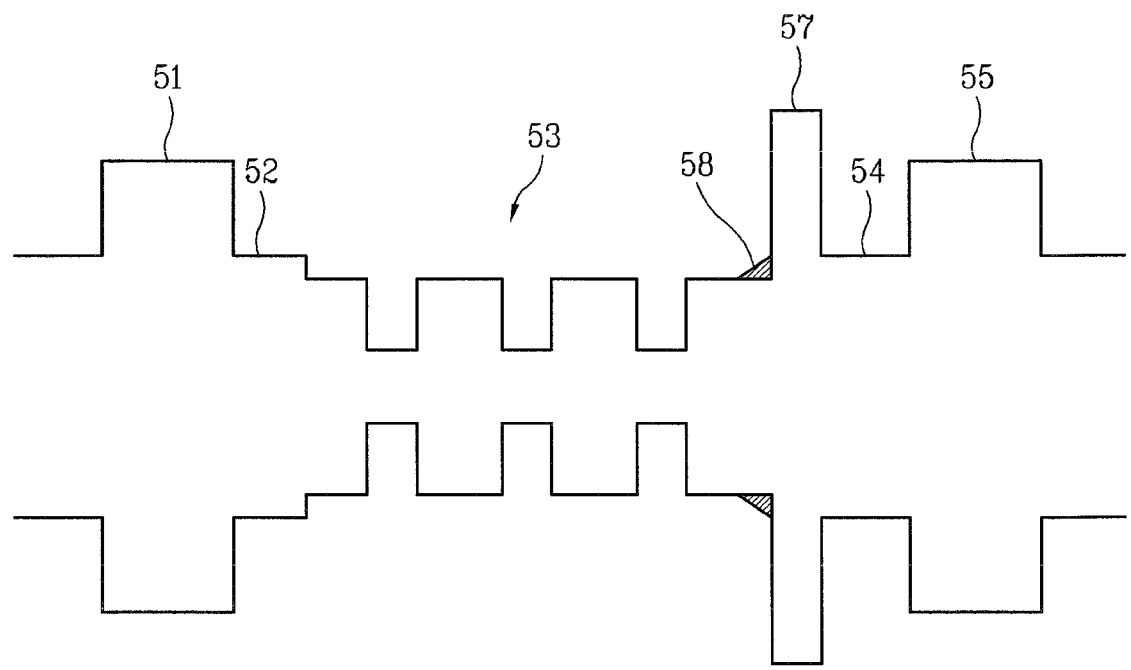
FIG. 6B is an energy band diagram in the case in which the nitride semiconductor layer includes an intermediate layer according to a first embodiment.

As shown in FIG. 6B, the intermediate layer 58 has a composition of $In_xGa_{1-x}N$ ($0 \leqq x \leqq 0.2$), in which the content of In is variable to obtain an energy band having a desired gradient. For example, the content of In may be varied between a start content of 20% and an end content of 0%. Thus, it is possible to obtain a structure having an energy band as shown in FIG. 6B.

The intermediate layer 58, which has the above-described composition, can reduce the strength and lattice constant differences between the active layer 53 and the electron block layer 57. Accordingly, it is possible to prevent an abrupt energy band gradient and strain from being generated at the interface between the active layer 53 and the electron block layer 57.

It is preferred that the start content of In in the composition of the intermediate layer 58 be equal to the content of In in the composition of the active layer 53.

Figure 6C:
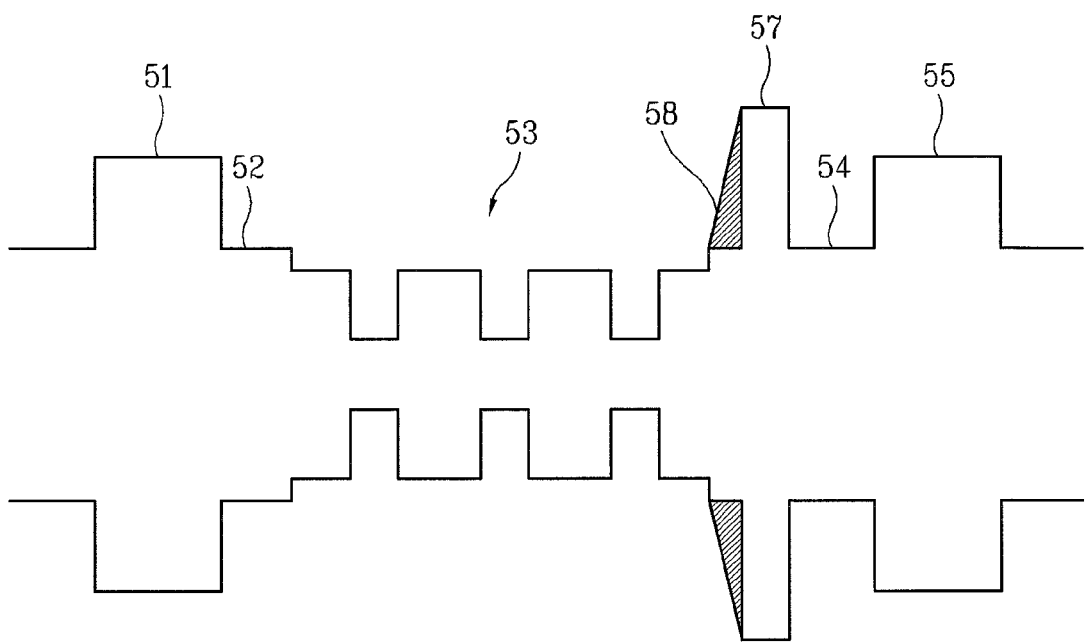
FIG. 6C is an energy band diagram in the case in which the nitride semiconductor layer includes an intermediate layer according to a second embodiment.

As shown in FIG. 6C, the intermediate layer 58 may also have a composition of $Al_yGa_{1-y}N$ ($0 \leqq x \leqq 0.2$, and $0 \leqq y \leqq 0.5$), in which the contents of In and Al are variable.

For example, the content of Al may be varied between a start content of 0% and an end content of 50%.

It is preferred that the end content of Al in the composition of the intermediate layer 58 be equal to the content of Al in the composition of the electron block layer 57.

Figure 6D:
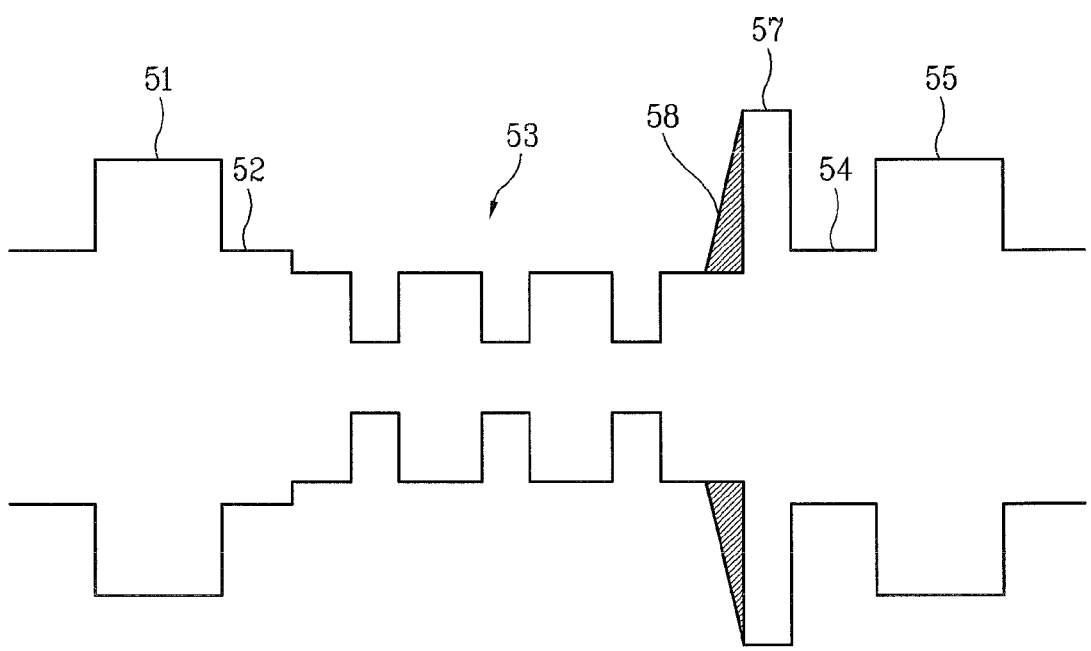
FIG. 6D is an energy band diagram in the case in which the nitride semiconductor layer includes an intermediate layer according to a third embodiment.

Also, as shown in FIG. 6D, the intermediate layer 58 may have a composition of $In_xAl_yGa_{1-x-y}N$ ($0 \leqq y \leqq 0.5$), in which the content of Al is variable. For example, the content of In may be varied between a start content of 20% and an end content of 0%, and the content of Al may be varied between a start content of 0% and an end content of 50%.

It is preferred that the start content of In in the composition of the intermediate layer 58 be equal to the content of In in the composition of the active layer 53, and the end content of Al in the composition of the intermediate layer 58 be equal to the content of Al in the composition of the electron block layer 57.

Figure 7:
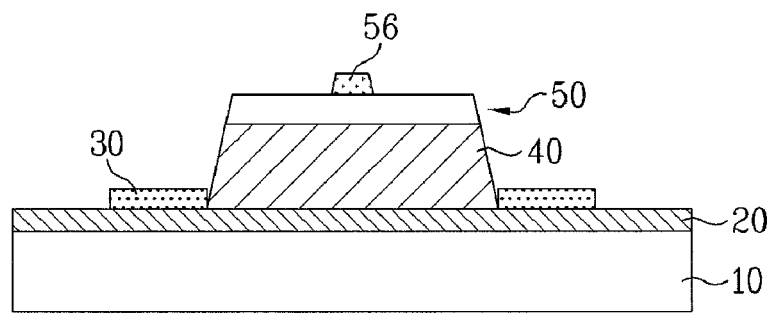
FIG. 7 is a sectional view illustrating a waveguide formed on the structure of FIG. 5B.

After the crystal growth of the nitride semiconductor layer 50 as described above, the second clad layer 55 of the nitride semiconductor layer 50 is patterned to form a stripe-shaped structure as a waveguide 56, as shown in FIG. 7, in order to achieve single-mode oscillation and to obtain low oscillation initiating current.

Figure 8:
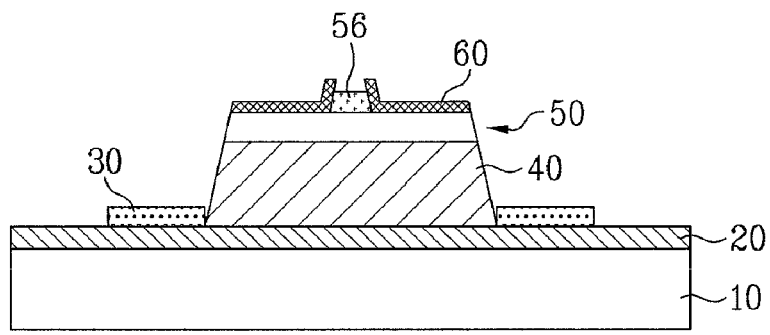
FIG. 8 is a sectional view illustrating a current narrowing layer formed on the structure of FIG. 7.

After the formation of the waveguide 56, as shown in FIG. 8, an insulating thin film is formed on the resultant surface of the nitride semiconductor layer 50, except for the upper and side surfaces of the stripe-shaped structure or only the upper surface of the stripe-shaped structure. Thus, a current narrowing layer 60 is formed.

Figure 9:
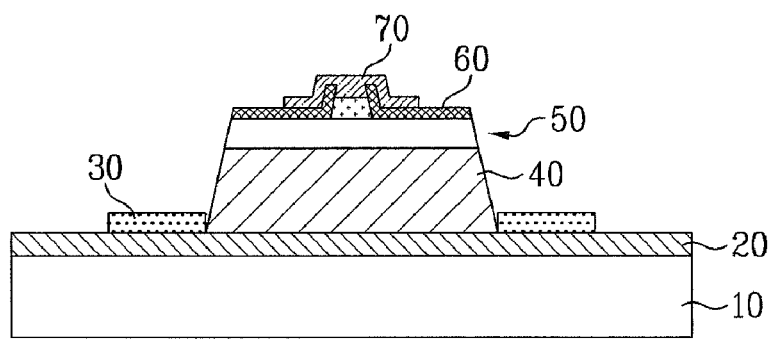
FIG. 9 is a sectional view illustrating a first electrode formed on the structure of FIG. 8.

A first electrode 70 comprised of a metal layer is then formed on the current narrowing layer 60 such that the exposed portion of the current narrowing layer 60 is covered by the first electrode 70, as shown in FIG. 9.

In order to manufacture a high-power laser device, it is preferred that the current narrowing layer 60 be formed to have an inner stripe structure arranged near the active layer 53 or the light guide layers 52 and 54. In this case, there are advantages in that it is possible to more effectively supply highly-dense current to the active layer 53, to reduce the contact resistance of the first electrode 70, and to achieve an improvement in heat radiation.

Figure 10:
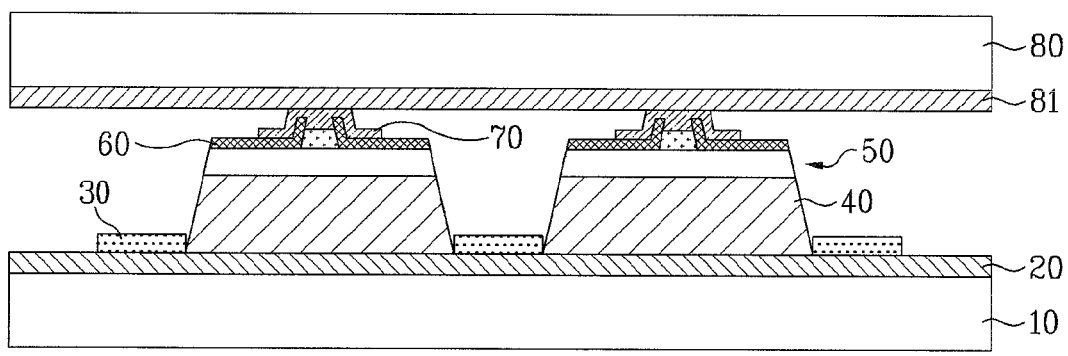
FIG. 10 is a sectional view illustrating an auxiliary substrate attached to the structure of FIG. 9.

After the formation of the first electrode 70 as described above, an auxiliary substrate 80, which is made of sapphire, a metal, or a semiconductor, is attached to the upper surface of the first electrode 70, using an adhesive 81 having a desired adhesion force, for example, wax, as shown in FIG. 10.

Figure 11:
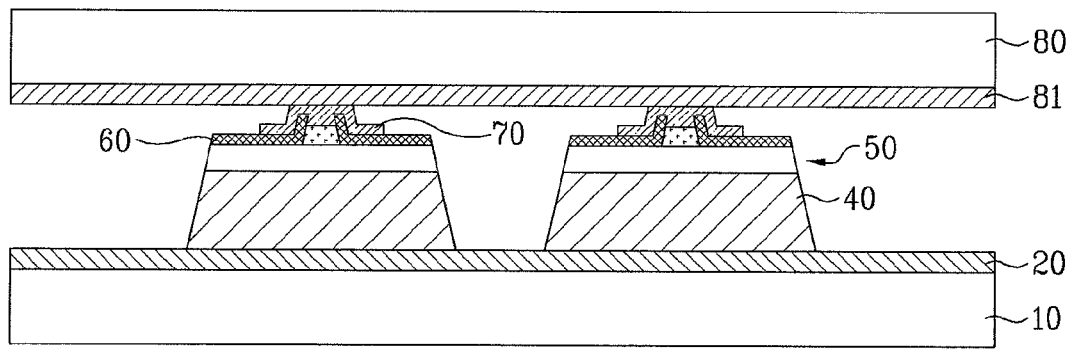
FIG. 11 is a sectional view illustrating a removed state of the mask used for selective growth.
Figure 12:
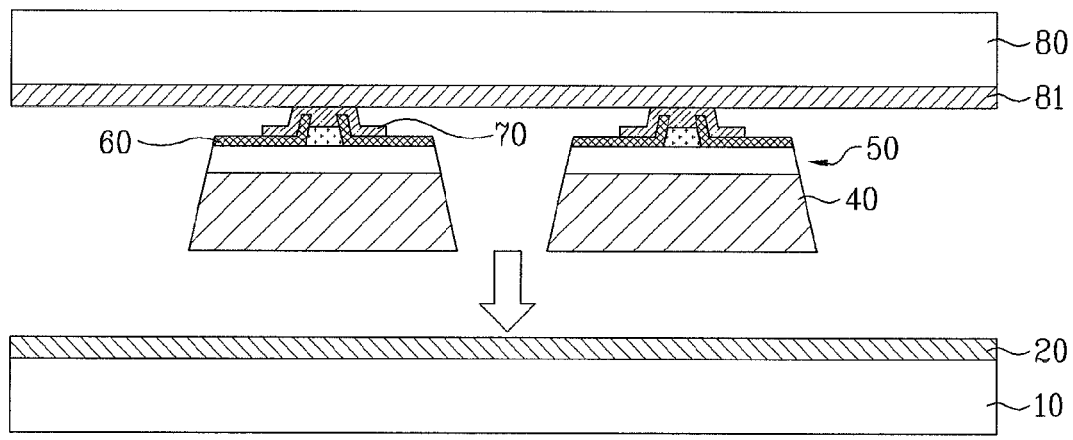
FIG. 12 is a sectional view illustrating a separated state of the substrate.

Thereafter, as shown in FIG. 11, the mask 30 used for the selective growth is dissolved, using an etching solution such as HF or BOE. Only the buffer layer 20 is then selectively etched in a lateral direction, using aqua regia or strong acid. Thus, the ridge-shaped nitride crystal layer 40 is separated from the mother substrate 10, as shown in FIG. 12.

The separation of the ridge-shaped nitride crystal layer 40 from the mother substrate 10 may be achieved using a selective chemical etching method or a laser lift-off method. The laser lift-off method is a kind of an optical method. Of these methods, the selective chemical etching method is preferable in that there is no damage to the surface of the mother substrate 10. Of course, the laser lift-off method may be effectively used.

In a general laser lift-off method, a high-power laser is irradiated onto a back surface of the substrate 10, so that high light energy is absorbed into a region near the interface between the substrate 10 and the semiconductor crystals or into the buffer layer 20. As a result, the nitride or oxide present in the region near the interface or in the buffer layer 20 is thermally decomposed into nitrogen (oxygen) and metal. Thus, the ridge-shaped nitride crystal layer 40 is separated from the substrate 10.

Figure 13:
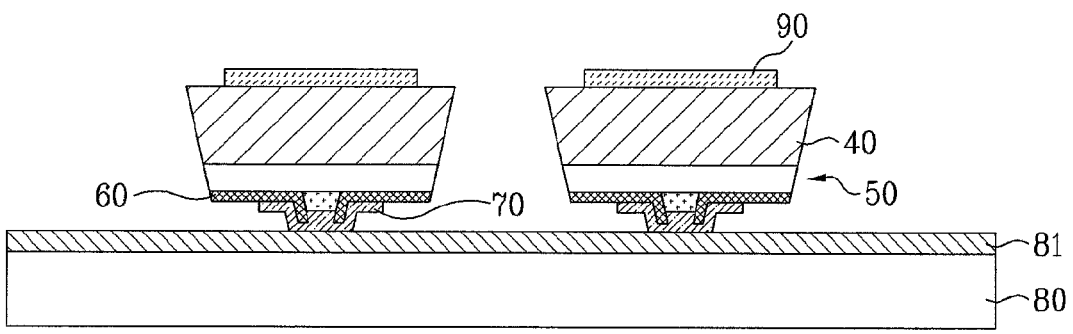
FIG. 13 is a sectional view illustrating a second electrode formed on the structure of FIG. 12.
Figure 14:
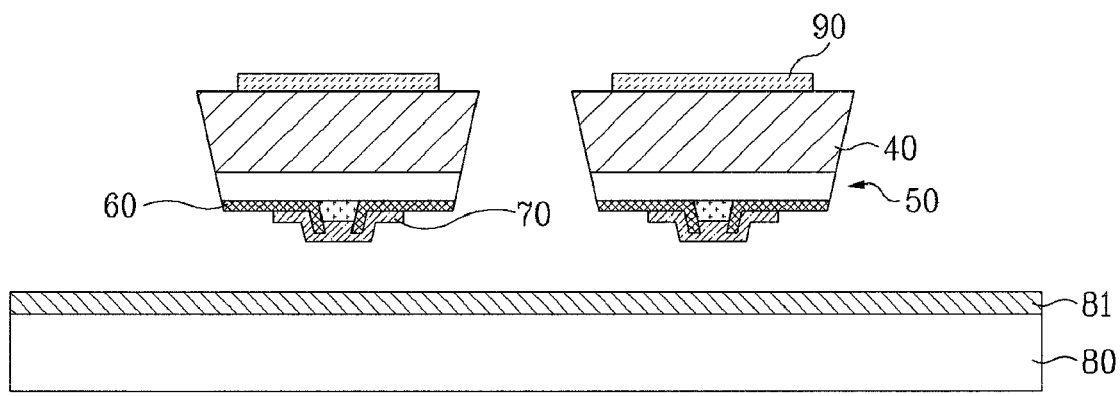
FIG. 14 is a sectional view illustrating a separated state of the auxiliary substrate.

Thereafter, as shown in FIG. 13, a second electrode 90 is formed on an exposed surface of the ridge-shaped nitride crystal layer 40 separated from the mother substrate 10 while being attached to the auxiliary substrate 80. The adhesive present between the ridge-shaped nitride crystal layer 40 and the auxiliary substrate 80 is dissolved, using a solvent, etc. Thus, a bar-shaped crystal structure is obtained, as shown in FIG. 14.

Figure 15:
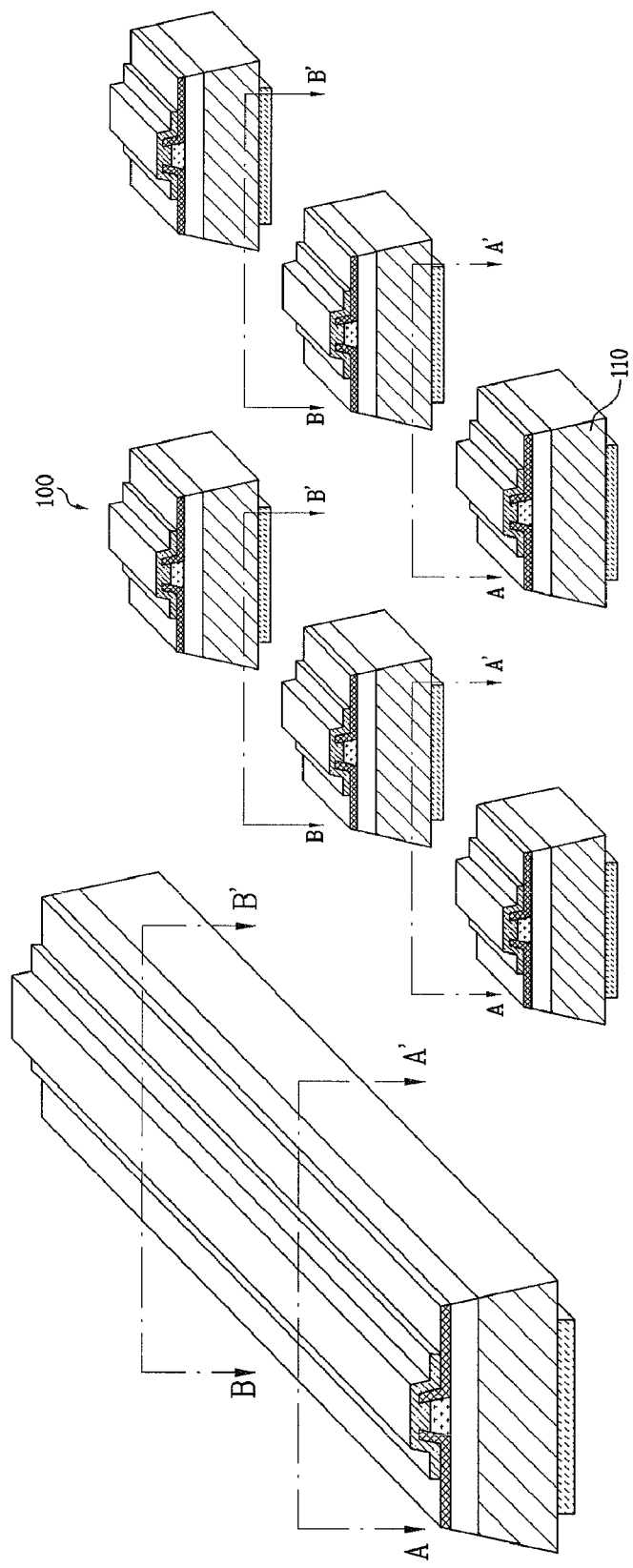
FIG. 15 is a perspective view illustrating a mirror surface formed in accordance with a cleaving process.

Subsequently, a mirror surface 110 for laser oscillation is formed on the bar-shaped crystal structure such that it extends in a direction normal to the stripe-shaped waveguide 56, as shown in FIG. 15. The formation of the mirror surface 110 may be achieved by mechanically scribing the bar-shaped crystal structure in a direction normal to the waveguide 56 (along regions taken along the lines A-A' and B-B', namely, along natural cleavage surfaces), or performing a scribing process using a high-power laser beam, and then performing a cleaving process. Thus, individual devices 100 are completely manufactured.

The scribing process is carried out to easily generate a natural cleavage along a desired region. To this end, a part of or the overall portion of the side, upper, or lower surface of the bar-shaped crystal structure is scratched so that a natural cleavage occurs in the scratched region.

For a plurality of ridge-shaped nitride crystal layers, the scribing process may be carried out in a simultaneous manner under the condition in which the ridge-shaped nitride crystal layers are in a state of being attached to the auxiliary substrate, or may be carried out in a sequential manner under the condition in which the ridge-shaped nitride crystal layers are in a state of being separated from the auxiliary substrate, in the form of individual bar-shaped crystal structures.

Figure 16:
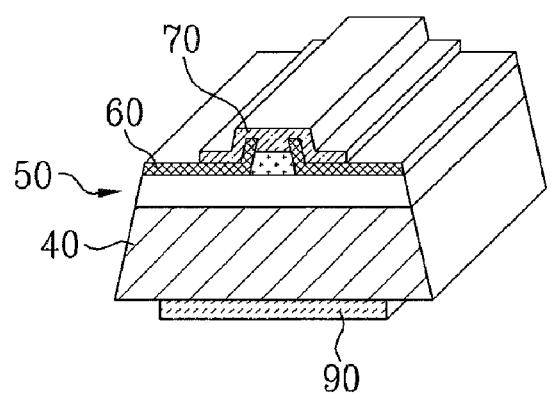
FIG. 16 is a perspective view illustrating a device structure completely manufactured.
Figure 17:
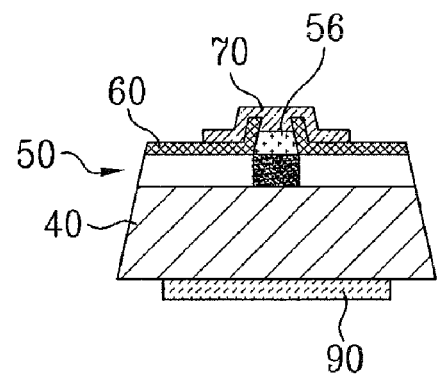
FIG. 17 is a sectional view illustrating the device structure.

Each device 100, which is manufactured in the above-described processes, may have a structure shown in FIGS. 16 and 17.

If necessary, a protection film, a low-reflective film or a high-reflective film may be formed on each cleavage surface, to adjust a reflectivity or to suppress a degradation.

As apparent from the above description, in accordance with the present invention, a laser device is manufactured using a high-quality single-crystalline GaN-based substrate, which is used as a mother substrate, and is then separated from the mother substrate, in order to enable the mother substrate to be again used.

In addition to the mother substrate, the auxiliary substrate 80 is also separated to be again used. Thus, the manufacturing costs of the device can be reduced.

Since the semiconductor crystal layer is selectively grown, using a mask layer extending in the same direction as the cleaving direction of the semiconductor crystal layer, it is possible to easily control the growth of the semiconductor layer. The cleaving can also be easily achieved. Thus, it is possible to achieve an enhancement in the homogeneity of the characteristics of the device finally produced, and to achieve an enhancement in the reproducibility of the manufacture process including the crystal growth.

The device separation process and the mirror surface formation process can be simultaneously carried out. Accordingly, it is unnecessary to execute the device separation process, separately from the mirror surface formation process. It is also unnecessary to execute a polishing process to thin the substrate or a process applying mechanical impact, in order to achieve a desired cleavage. Thus, the device manufacture process is simplified, so that a high process yield can be obtained.

In addition, the present invention can also be applied to fields associated with light emitting diodes using a GaN-based material or high-speed and high-power electronic devices. Using a general polishing process, it is practically difficult to manufacture a device having a thickness of several micrometers (μm) or less because there may be a damage caused by impact during the polishing process. In accordance with the present invention, however, it is possible to easily manufacture a device having a thickness of several micrometers, and thus to obtain effects capable of achieving an enhancement in the characteristics of the device, in particular, an enhancement in heat radiation characteristics.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor light emitting device comprising:
   a first electrode;
   a semiconductor crystal layer arranged on the first electrode, the semiconductor crystal layer having a ridge-shaped structure, wherein an upper surface of the ridge-shaped structure is substantially planar;
   a semiconductor layer arranged on the upper surface of the ridge-shaped structure, the semiconductor layer having a multilayer structure comprising:
     a first clad layer;
     a first light guide layer;
     an active layer arranged on the first light guide layer;
     an electron block layer arranged on the active layer;

an intermediate layer arranged between the active layer and the electron block layer;

a second light guide layer arranged on the electron block layer; and a second clad layer arranged on the second light guide layer, wherein an energy band gap of the second clad layer is greater than an energy band gap of the second light guide layer, and wherein the intermediate layer is configured to reduce stain acting on the active layer or the electron block layer;

a waveguide arranged on the semiconductor layer;

a current narrowing layer arranged on the waveguide; and a second electrode arranged on the current narrowing layer.

2. The semiconductor light emitting device according to claim 1, wherein the semiconductor crystal layer has a thickness substantially greater than the multilayer semiconductor layer.

3. The semiconductor light emitting device according to claim 1, wherein the intermediate layer has a lattice constant or an energy band gap that ranges between those of the active layer and the electron block layer.

4. The semiconductor light emitting device according to claim 1, wherein the semiconductor light emitting device has a mirror surface in a direction substantially normal to the waveguide.

5. The semiconductor light emitting device according to claim 4, wherein the semiconductor layer is arranged on a planar surface of the semiconductor crystal layer.

6. The semiconductor light emitting device according to claim 5, wherein the mirror surface is parallel to a natural cleavage plane of the semiconductor crystal layer.

7. The semiconductor light emitting device according to claim 6, wherein the mirror surface is perpendicular to the planar surface of the semiconductor crystal layer.

8. The semiconductor light emitting device according to claim 4, wherein the mirror surface is not a polished surface.

9. The semiconductor light emitting device according to claim 1, wherein the intermediate layer comprises $In_xAl_yGa_{1-x-y}N$ (where, $0 \leq x \leq 0.2$ and $0 \leq y \leq 0.5$).

10. The semiconductor light emitting device according to claim 9, wherein the content of In or Al is different according to a position of the intermediate layer.

11. The semiconductor light emitting device according to claim 9, wherein the content of In or Al at a first position contacting the active layer is different from the content at a second position contacting the electron blocking layer.

12. The semiconductor light emitting device according to claim 11, wherein the content of In varies between a content of 20% at the first position and a content of 0% at the second position.

13. The semiconductor light emitting device according to claim 11, wherein the content of Al varies between a content of 0% at the first position and a content of 50% at the second position.

14. The semiconductor light emitting device according to claim 11, wherein the content of In of the intermediate layer at the first position is substantially equal to the content of In of the active layer.

15. The semiconductor light emitting device according to claim 11, wherein the content of Al of the intermediate layer at the second position is substantially equal to the content of Al of the electron block layer.

16. The semiconductor light emitting device according to claim 1, wherein the intermediate layer is arranged between the active layer and the second light guide layer.

17. A semiconductor light emitting device comprising:

a first electrode;

a semiconductor crystal layer arranged on the first electrode, the semiconductor crystal layer having a ridge-shaped structure, wherein an upper surface of the ridge-shaped structure is substantially planar;

a semiconductor layer arranged on the upper surface of the ridge-shaped structure, the semiconductor layer having a multilayer structure comprising:

a first clad layer;

a first light guide layer;

an active layer arranged on the first light guide layer;

an electron block layer arranged on the active layer;

an intermediate layer arranged between the active layer and the electron block layer;

a second light guide layer arranged on the electron block layer; and a second clad layer arranged on the second light guide layer, wherein an energy band gap of the second clad layer is greater than an energy band gap of the second light guide layer, and wherein the intermediate layer is configured to reduce stain acting on the active layer or the electron block layer;

a waveguide arranged on the semiconductor layer;

a current narrowing layer arranged on the waveguide; and a second electrode arranged on the current narrowing layer, wherein a composition of the intermediate layer is varied such that the composition adjacent to the active layer is different than the composition adjacent to the electron block layer.

18. The semiconductor light emitting device according to claim 1, wherein the semiconductor crystal layer has a trapezoidal cross-sectional shape.

19. The semiconductor light emitting device according to claim 17, wherein the semiconductor crystal layer has a trapezoidal cross-sectional shape.

* * * * *